United States Patent
Kimoto et al.

[11] Patent Number: 5,225,714
[45] Date of Patent: Jul. 6, 1993

[54] SAWTOOTH WAVEFORM GENERATOR FOR A CONVERGENCE CORRECTION CIRCUIT

[75] Inventors: Toshiyuki Kimoto; Miyuki Ikeda, both of Yokohama, Japan

[73] Assignee: Hitachi, Ltd., Tokyo, Japan

[21] Appl. No.: 625,024

[22] Filed: Dec. 10, 1990

[30] Foreign Application Priority Data

Dec. 19, 1989 [JP] Japan .................. 1-327090

[51] Int. Cl.$^5$ .................. H03K 4/08; H03L 7/00
[52] U.S. Cl. .................. 307/228; 307/261; 307/263; 307/264; 307/271; 307/491; 328/35; 328/127; 328/181
[58] Field of Search .......... 307/228, 261–264, 307/271, 491; 328/181, 127, 35, 113, 223

[56] References Cited

U.S. PATENT DOCUMENTS

| | | | |
|---|---|---|---|
| 2,728,857 | 12/1955 | Sziklai | 307/228 |
| 2,771,556 | 12/1953 | Anderson et al. | 328/223 |
| 2,862,171 | 11/1958 | Freeborn | 307/317.1 |
| 2,896,115 | 7/1959 | Guggi | 307/228 |
| 3,539,825 | 11/1970 | Hardaway | 307/228 |
| 3,564,428 | 2/1968 | Demark | 328/127 |
| 3,586,874 | 6/1971 | Ferro | 307/228 |
| 3,659,141 | 4/1972 | Kubala | 307/228 |
| 3,725,679 | 4/1973 | Darrow | 328/223 |
| 3,763,478 | 10/1973 | Yoshizawa et al. | 328/223 |
| 3,902,139 | 8/1975 | Harrel | 307/497 |
| 4,139,301 | 2/1979 | Chaborski | 328/223 |
| 4,216,392 | 8/1980 | Valkestijn | 307/491 |
| 4,329,599 | 5/1982 | Gregorian et al. | 307/497 |
| 4,359,649 | 11/1982 | Mundel | 307/228 |
| 4,760,319 | 7/1988 | Janz | 307/260 |
| 4,809,838 | 3/1989 | Houserman | 324/329 |
| 4,835,421 | 5/1989 | Khoury et al. | 307/491 |

FOREIGN PATENT DOCUMENTS

| | | | |
|---|---|---|---|
| 0623225 | 7/1961 | Canada | 307/228 |
| 0067320 | 4/1982 | Japan | 307/228 |
| 0197914 | 12/1982 | Japan | 307/228 |
| 2142200 | 10/1984 | United Kingdom | 307/228 |

Primary Examiner—John S. Heyman
Assistant Examiner—Terry D. Cunningham
Attorney, Agent, or Firm—Antonelli, Terry, Stout & Kraus

[57] ABSTRACT

Electric charges are stored on a capacitor and then the charges are discharged so that a sawtooth wave for use in a convergence correction circuit for a display or the like is generated. When the sawtooth wave is used for a multi-scan display, the charge period is varied according as the scanning frequency varies, and as a result, a phase error is produced in the parabolic wave obtained by squaring the sawtooth wave. To eliminate the phase error, it is adapted such that the discharging current from the capacitor is passed through a coil and, in addition, the period as the reciprocal of the resonant frequency of the resonance circuit formed of the coil and the capacitor is set to be virtually double the discharge period.

4 Claims, 3 Drawing Sheets

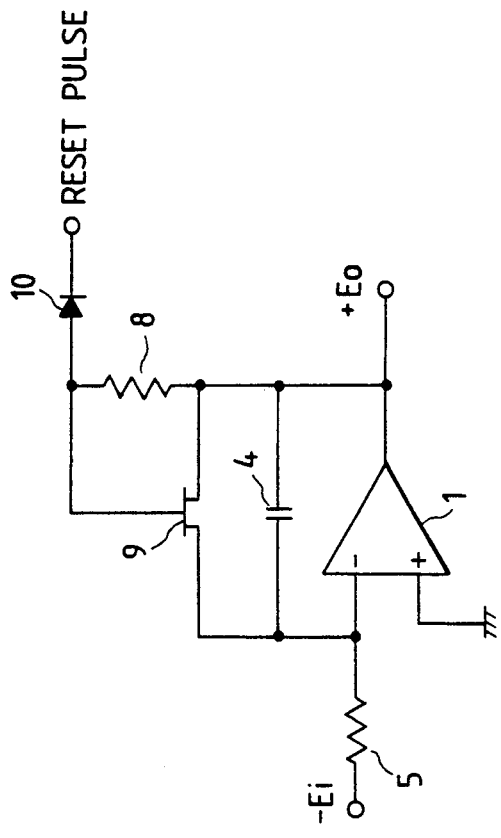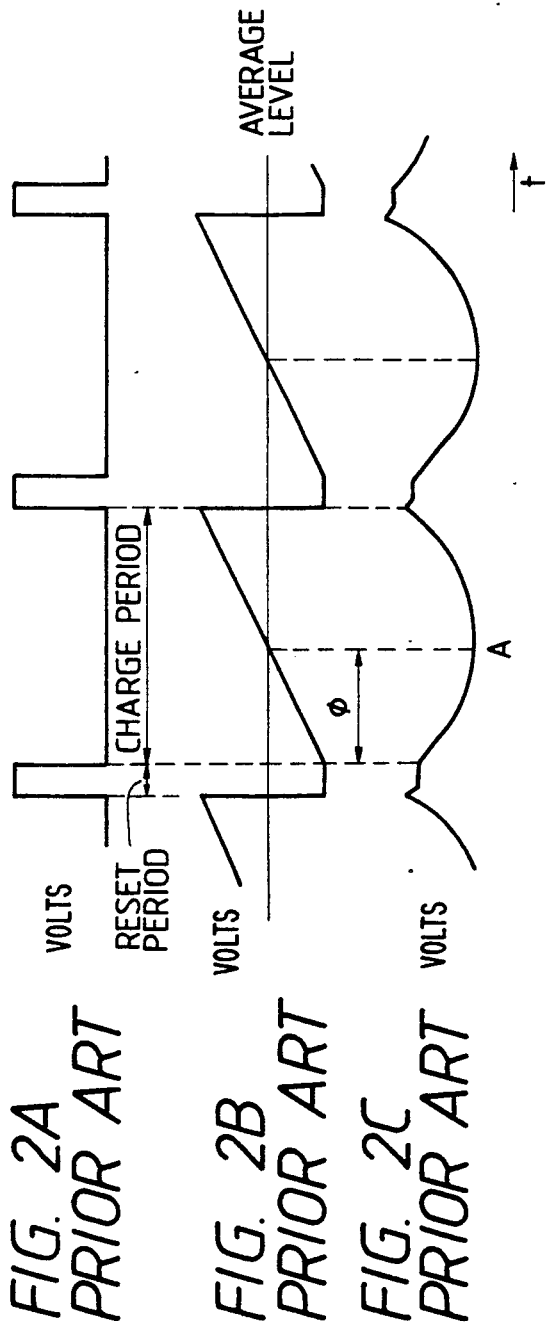
FIG. 1 PRIOR ART
FIG. 2A PRIOR ART
FIG. 2B PRIOR ART
FIG. 2C PRIOR ART

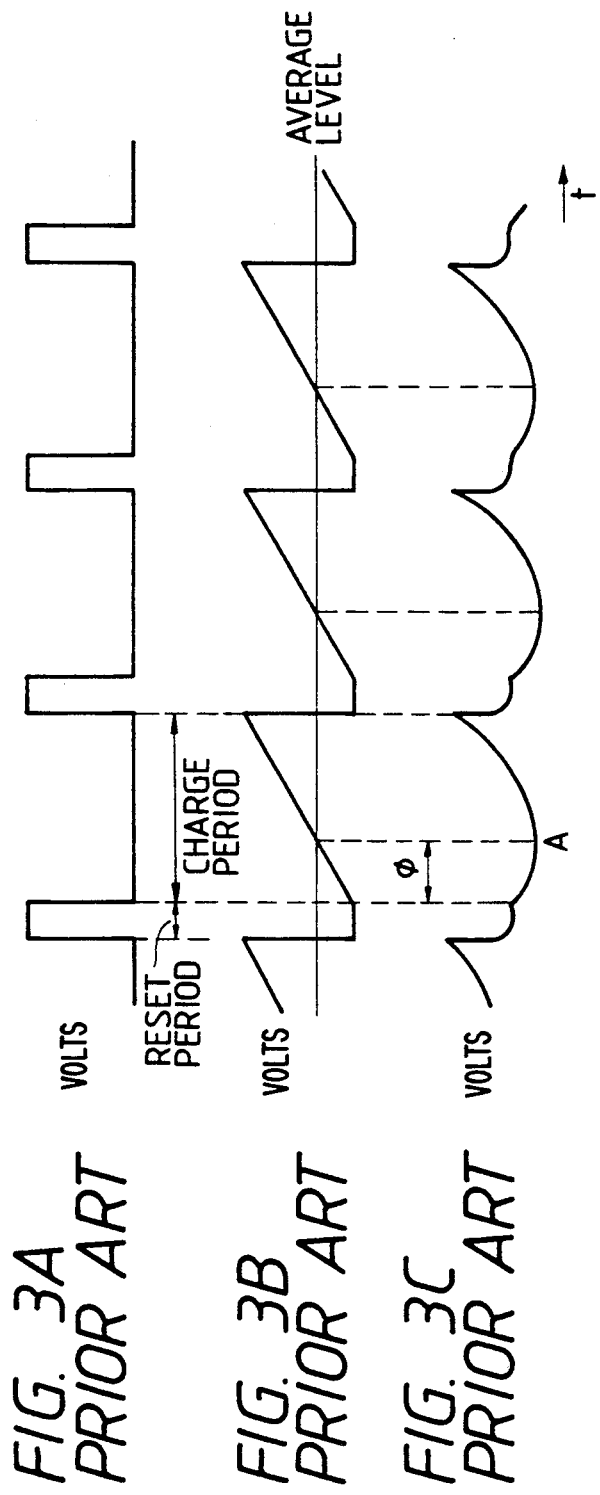
FIG. 3A PRIOR ART
FIG. 3B PRIOR ART
FIG. 3C PRIOR ART
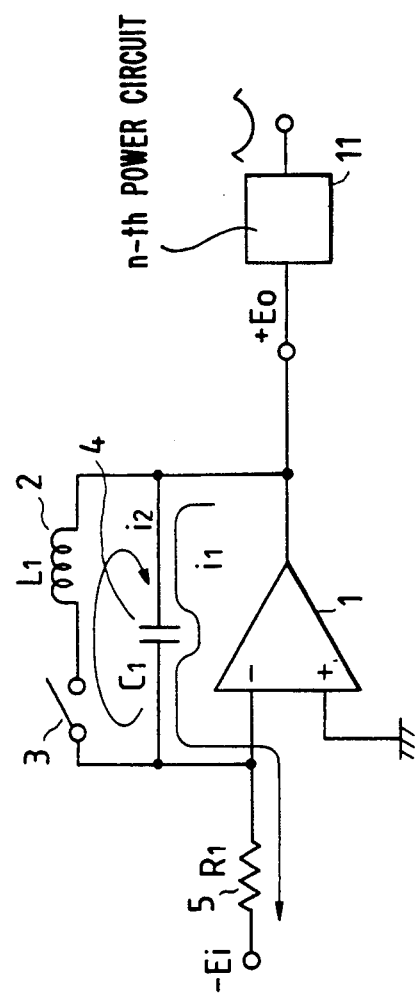
FIG. 4

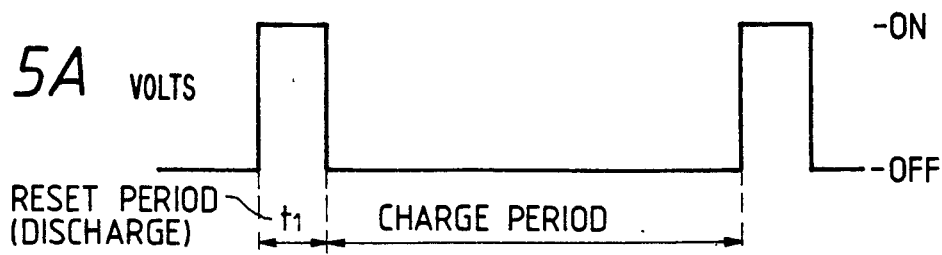
FIG. 5A
FIG. 5B
FIG. 5C
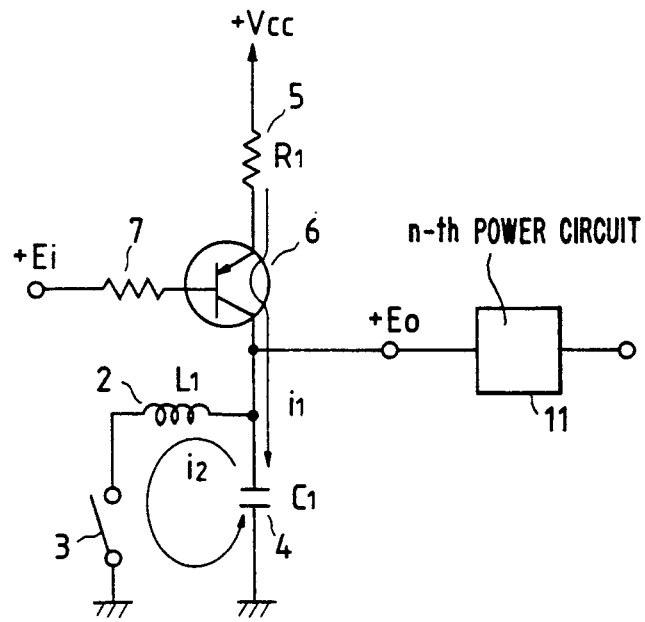
FIG. 6

SAWTOOTH WAVEFORM GENERATOR FOR A CONVERGENCE CORRECTION CIRCUIT

BACKGROUND OF THE INVENTION

The present invention relates to a sawtooth waveform generator suitable for use in a convergence correction circuit for a display apparatus such as a multi-scan display (supporting multiple frequencies) or the like.

FIG. 1 is a circuit diagram showing a conventional sawtooth waveform generator.

Referring to FIG. 1, reference numeral 1 denotes an operational amplifier, 4 denotes a capacitor, 5 and 8 denote resistors, 9 denotes a MOSFET, and 10 denotes a diode.

In the sawtooth generator shown in FIG. 1, the operational amplifier 1 forms part of a constant current supply circuit together with a resistor 5 and the MOSFET 9 is used as a switch, and a reset pulse is applied to the gate of the MOSFET 9 through the diode 10. First, the capacitor 4 is charged by a constant current from the operational amplifier 1, and then, the electric charges on the capacitor 4 are discharged owing to the MOSFET 9 held on during the reset period of the reset pulse, and thus a sawtooth voltage is thereby generated as an output $+E_0$.

When the sawtooth waveform generator is used, for example, in a convergence correction circuit for a display apparatus, the generated sawtooth wave is squared and a parabolic voltage is thereby obtained, and such a parabolic voltage is used as the correction signal for convergence correction. Further, the n-th power of the same is used as a correction signal of geometric distortion.

FIG. 2A to FIG. 2C and FIG. 3A to FIG. 3C are waveform diagrams showing voltage waveforms at principal portions in FIG. 1 and other waveforms related thereto.

FIG. 2A and FIG. 3A show voltage waveforms of reset pulses, FIG. 2B and FIG. 3B show waveforms of A.C. components of output voltages $+E_0$, and FIG. 2C and FIG. 3C show square waveforms of the waveforms in FIG. 2B and FIG. 3B.

In the conventional sawtooth waveform generator shown in FIG. 1, when a reset pulse as shown in FIG. 2A is input thereto, a sawtooth voltage as shown in FIG. 2B (the waveform of FIG. 2B shows the A.C. component of the sawtooth voltage) is generated.

When the sawtooth waveform generator is used, for example, in a convergence correction circuit for a display apparatus, as described above, the generated sawtooth voltage is squared for obtaining a correction signal for convergence correction. Then, a parabolic voltage as shown in FIG. 2C is obtained.

While no problem arises as long as the above mentioned display apparatus remains an ordinary display, the following problems arise when the same is a multi-scan display.

As well known, a multi-scan display must support a wide variety of frequencies. Hence, the convergence circuit therefor must also be able to support multiple frequencies. Therefore, the sawtooth generator must be able to generate sawtooth voltages at various frequencies.

Then, when the charge period in the reset pulse is varied with the pulse width (i.e., the reset period) kept constant in order that a sawtooth voltage at a frequency different from that shown in FIG. 2B is generated in a conventional sawtooth generator as shown in FIG. 1, the reset pulse becomes, for example, as shown in FIG. 3A.

If such reset pulse is input, a sawtooth voltage as shown in FIG. 3B (the waveform in FIG. 3B shows the A.C. component) is generated and if, then, the generated sawtooth voltage is squared for obtaining a correction signal for convergence correction, a parabolic voltage as shown in FIG. 3C is obtained.

When the charge period of the reset pulse is varied with the pulse width kept constant, as seen from comparison of FIGS. 3A, 3B with FIGS. 2A, 2B, the generated sawtooth voltage suffers a change in its average level because the relation of duties between the reset period and the charge period is changed. More specifically, while the average level in the case of FIG. 2B is slightly below the level in the middle between the maximum value and minimum value of the sawtooth wave, the average level in the case of FIG. 3B is considerably below the level in the middle between the maximum value and minimum value of the sawtooth wave.

Further, as seen from comparison of FIG. 3C with FIG. 2C, a large phase error is produced in the parabolic voltage obtained by squaring the sawtooth voltage with the above described change in the average level. When the trough portion of the parabolic voltage (which temporally corresponds to the point of intersection of the sawtooth voltage and the average level during the charge period) is designated as point A, this point A in the case of FIG. 2C is located slightly to the left of the point in the middle of the charge period, but the point A in the case of FIG. 3C is located considerably to the left of the midpoint of the charge period. When the phases $\phi$ from the point at the trailing edge of the reset pulse to the point A are compared, it is known that the phase $\phi$ in FIG. 3C is smaller than the phase $\phi$ in FIG. 2C and thus a phase error is produced in FIG. 3C.

The phase error produced in the parabolic voltage due to the arrangement to vary the frequency becomes a factor deteriorating the characteristic of a multi-scan display to follow frequency changes. Therefore, such a sawtooth waveform generator as shown in FIG. 1 has been unable to be used in a convergence circuit for a multi-scan display.

SUMMARY OF THE INVENTION

An object of the present invention is to provide a sawtooth waveform generator overcoming the above described problem encountered in the conventional art, capable of generating sawtooth waves for various frequencies, and, in addition, capable of reducing to a minimum the change in the average level of the sawtooth voltage generated in response to variations in frequency.

In order to achieve the above mentioned object, the present invention has been adapted such that a capacitor is charged with electric charges and then discharged to generate a sawtooth wave, the discharging current from the capacitor is passed through a coil, and a period which is the reciprocal of the resonant frequency of the resonant circuit formed of the coil and the capacitor is set to be virtually double the length of the discharge period, and thus the phase error is eliminated.

BRIEF DESCRIPTION OF THE DRAWINGS

FIG. 1 is a circuit diagram of a conventional sawtooth waveform generator;

FIGS. 2A, 2B, and 2C and FIGS. 3A, 3B, and 3C are voltage waveform diagrams at principal portions in FIG. 1;

FIG. 4 is a circuit diagram of a sawtooth waveform generator according to an embodiment of the present invention;

FIGS. 5A, 5B, and 5C are voltage waveform diagrams at principal portions in FIG. 4; and FIG. 6 is a circuit diagram of a sawtooth waveform generator according to another embodiment of the present invention.

DESCRIPTION OF THE PREFERRED EMBODIMENTS

FIG. 4 is a circuit diagram showing an embodiment of the present invention.

Referring to FIG. 4, reference numeral 2 denotes a coil, 3 denotes a switch. and other parts corresponding to those in FIG. 1 are denoted by like reference numerals.

In the sawtooth generator shown in FIG. 4, an operational amplifier 1 forms a part of a constant current supply circuit together with the resistor 5 and the switch 3 is ON/OFF controlled by a reset pulse.

When the switch 3 is turned off (charge period) by the reset pulse, the capacitor 4 is charged by a constant current from the constant current supply circuit. The value of the charging current $i_1$ at this time is determined by the resistance $R_1$ of the resistor 5 and the capacitance $C_1$ of the capacitor 4.

Then, when the switch 3 is turned on (reset period) by the reset pulse, a discharging current $i_2$ is let flow and the charges on the capacitor 4 are thereby discharged. The generated sawtooth wave is processed by an n-th power circuit 11, i.e., squared, for example, to be converted to a parabolic wave.

As the switch 3, a MOSFET or an analog switch is generally used.

FIG. 5A to FIG. 5C are waveform diagrams showing voltage waveforms at principal portions in FIG. 4.

FIG. 5A shows the voltage waveform of the reset pulse, FIG. 5B shows the waveform of the output voltage $+E_0$ when there is provided no coil 2, while FIG. 5C shows the waveform of the output voltage $+E_0$ when there is provided the coil 2.

Supposing now that there is provided no coil 2, the circuit configuration is basically the same as the conventional sawtooth generator shown in FIG. 1 and, hence, when the reset pulse is as shown in FIG. 5A, the output voltage $+E_0$ becomes as shown in FIG. 5B, which voltage is virtually the same as that in FIG. 2B and FIG. 3B.

Now, the average level of the sawtooth voltage in FIG. 5B will be considered.

The average level of the overall waveforms, i.e., the average level for one period, lies below the level in the middle between the maximum value and minimum value of the sawtooth wave, the same as in FIG. 2B and FIG. 3B. The average level only for the charge period lies right in the middle between the maximum value and minimum value of the sawtooth wave, while the average level for the reset period (discharge period) lies considerably below the level in the middle between the maximum value and minimum value of the sawtooth wave.

From the above, it is know that the lying of the average level of the overall waveform below the level in the middle between the maximum value and minimum value of the sawtooth wave is due to the fact that the average level for the reset period (discharge period) lies considerably below the level in the middle of the maximum value and minimum value of the sawtooth wave.

Then, to achieve generation of sawtooth voltages for various frequencies, the cases of the reset pulse of which the charge period is varied while the pulse width (i.e., reset period) is kept constant will be considered.

When only the charge period is varied while the pulse width (i.e., reset period) is kept constant, the average level for the charge period remains constant regardless of the variations in the charge period, that is, it lies, as described above, right in the middle between the maximum value and minimum value of the sawtooth wave. The average level for the reset period naturally remains constant because the reset period is kept constant, that is, it lies, as described above, considerably below the level in the middle between the maximum value and the minimum value of the sawtooth wave.

Consequently, the average level of the overall waveform lies below the level in the middle between the maximum value and minimum value of the sawtooth wave varying with the change in the relation of duties between the reset period and the charge period.

From the above, it is known that, when only the charge period is varied with the pulse width (i.e., reset period) kept constant, the average level of the overall waveform can be kept unchanged by bringing the average level for the reset period into the middle between the maximum value and minimum value of the sawtooth wave.

Therefore, it is adapted in the present embodiment such that a coil 2 is provided in the path conducting the discharging current $i_2$, connected in series with the switch 3 and in parallel with the capacitor 4, as shown in FIG. 4.

By virtue of such arrangement, when the switch 3 is turned on (reset period) responding to the reset pulse as shown in FIG. 5A, a parallel resonance is produced by the coil 2 and the capacitor 4, and a resonance current is thereby let flow as the discharging current $i_2$. As a result, the output voltage $+E_0$ becomes as shown in FIG. 5C and, thus, the waveform during the reset period virtually becomes a sinusoidal wave. Further, if the reset period, denoted by $t_1$, the capacitance of the capacitor 4, denoted by $C_1$, and the inductance of the coil 2, denoted by $L_1$, are set so that the relationship $$t_1 = \pi \sqrt{C_1 \cdot L_1}$$

holds, the waveform during the reset period becomes just a half wavelength of a sinusoidal wave, and thus, the average level for the reset period is brought into the middle between the maximum value and minimum value of the sawtooth wave.

With the above described arrangement, it becomes possible to minimize change of the average level of the overall waveform when the charge period is varied with the pulse width (reset period) of the reset pulse kept constant for generating sawtooth voltages for various frequencies.

FIG. 6 is a circuit diagram showing another embodiment of the present invention.

Referring to FIG. 6, reference numeral 6 denotes a transistor and 7 denotes a resistor. Other parts corresponding to those in FIG. 4 are denoted by like reference numerals.

In the sawtooth waveform generator shown in FIG. 6, the transistor 6 forms part of the constant current supply circuit.

When the switch 3 is turned off (charge period) by a reset pulse, the capacitor 4 is charged by a constant current from the constant current supply circuit. The value of the charging current $i_1$ at this time is determined by the voltage $+E_1$ applied to the base of the transistor 6.

When the switch 3 is then turned on (reset period) by the reset pulse, a discharging current $i_2$ whereby the capacitor 4 is discharged is let flow.

Also, in the present embodiment, a coil 2 is provided in the path through which the discharging current $i_2$ flows, connected in series with the switch 3 and in parallel with the capacitor 4, the same as in the embodiment shown in FIG. 4. With such arrangement, it becomes possible to minimize the change of the average level of the overall waveform when the charge period is varied with the pulse width (i.e., reset period) of a reset pulse kept constant in order to generate sawtooth voltages for various frequencies.

According to the sawtooth waveform generator of the present invention as described in the foregoing, it is made possible to generate sawtooth voltages for various frequencies and, in addition, to reduce the change of the average level of the sawtooth voltage responding to the varied frequencies to a minimum.

Therefore, when a parabolic voltage is produced by squaring the sawtooth voltage obtained as described above, little phase error owing to the varied frequency occurs in the parabolic voltage. That is, the phase from the point at the trailing edge of the reset pulse to the trough portion of the parabolic wave can be kept virtually constant irrespective of changes in the frequency.

As a result, when the sawtooth waveform generator of the present invention is used in a convergence correction circuit for a multi-scan display, the characteristic of the multi-scan display to follow frequency changes suffers no such deterioration as experienced in the conventional types. Accordingly, such an effect is obtained that the present invention can be used in the convergence correction circuit for a multi-scan display and the versatility of the sawtooth waveform generator can therefore be greatly enhanced.

What is claimed is:

1. A circuit for generation of a sawtooth wave for use in a convergence correction circuit for a display comprising:

capacitor means;

current circuit means including an operational amplifier for providing an output for supplying a current to said capacitor means, thereby storing electric charges thereon; and a series circuit including a switch and a coil, said series circuit being connected to the output of said current circuit means, said capacitor means being connected to the output of said current circuit means, said series circuit being connected in parallel with said capacitor means, said switch being turned ON at intervals of a predetermined period for discharging the charges stored on said capacitor means;

wherein said coil and said capacitor means form a resonant circuit having a resonant frequency so that a period which is the reciprocal of the resonant frequency is set to be virtually double the ON period of said switch.

2. A circuit according to claim 1, wherein said series circuit is formed only of said switch and said coil.

3. A circuit according to claim 1, wherein one terminal of said capacitor means and one terminal of said series circuit are connected to the output of said current circuit means capacitor and another terminal of said capacitor and another terminal of said series circuit are connected to the same potential.

4. A circuit according to claim 1, wherein one terminal of said capacitor means and one terminal of said switch are connected to an input of said operational amplifier, another terminal of said switch being connected to one terminal of said coil, another terminal of said coil and another terminal of said capacitor means being connected to an output of said operational amplifier, another input terminal of said operational amplifier being connected to a reference potential.

* * * * *